United States Patent
Sung et al.

(10) Patent No.: US 8,815,713 B2
(45) Date of Patent: Aug. 26, 2014

(54) REDUCING PATTERN LOADING EFFECT IN EPITAXY

(71) Applicant: Taiwan Semiconductor Manufacturing Company, Ltd., Hsin-Chu (TW)

(72) Inventors: Hsueh-Chang Sung, Khubei (TW); Tsz-Mei Kwok, Hsin-Chu (TW); Kuan-Yu Chen, Taipei (TW); Kun-Mu Li, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/671,243

(22) Filed: Nov. 7, 2012

(65) Prior Publication Data

US 2014/0127886 A1    May 8, 2014

(51) Int. Cl.
*H01L 21/20* (2006.01)

(52) U.S. Cl.
USPC .......................................................... 438/478

(58) Field of Classification Search
None
See application file for complete search history.

(56) References Cited

U.S. PATENT DOCUMENTS

2011/0117732 A1*  5/2011  Bauer et al. ................... 438/507
2013/0105861 A1*  5/2013  Liao et al. ...................... 257/192

* cited by examiner

*Primary Examiner* — Scott B Geyer
(74) *Attorney, Agent, or Firm* — Slater and Matsil, L.L.P.

(57) ABSTRACT

A method includes forming a gate stack over a semiconductor substrate, forming an opening in the semiconductor substrate and adjacent to the gate stack, and performing a first epitaxy to grow a first semiconductor layer in the first opening. An etch-back is performed to reduce a thickness of the first semiconductor layer. A second epitaxy is performed to grow a second semiconductor layer over the first semiconductor layer. The first and the second semiconductor layers have different compositions.

18 Claims, 8 Drawing Sheets

REDUCING PATTERN LOADING EFFECT IN EPITAXY

BACKGROUND

Reduction of the size and the inherent features of semiconductor devices (e.g., Metal-Oxide Semiconductor (MOS) devices) has enabled continued improvement in speed, performance, density, and cost per unit function of integrated circuits over the past few decades. In accordance with a design of the MOS devices and one of the inherent characteristics thereof, modulating the length of a channel region underlying a gate between a source and drain of a MOS device alters a resistance associated with the channel region, thereby affecting a performance of the MOS device. More specifically, shortening the length of the channel region reduces a source-to-drain resistance of the MOS device, which, assuming other parameters are maintained relatively constant, may allow an increase in current flow between the source and drain when a sufficient voltage is applied to the gate of the MOS device.

To further enhance the performance of MOS devices, stress may be introduced in the channel region of a MOS device to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

A commonly used method for applying compressive stress to the channel regions of PMOS devices is growing SiGe stressors in the source and drain regions. Such a method typically includes the steps of forming a gate stack on a semiconductor substrate, forming spacers on sidewalls of the gate stack, forming recesses in the silicon substrate along gate spacers, epitaxially growing SiGe stressors in the recesses and annealing. Since SiGe has a greater lattice constant than silicon, it expands after annealing and applies a compressive stress to the channel region, which is located between a source SiGe stressor and a drain SiGe stressor.

The above-discussed method, however, suffers from the drawback of pattern-loading effects, which occur due to a difference in pattern densities. The pattern-loading effects pertain to a phenomenon occurring upon simultaneous epitaxial growth in a region of a higher pattern density and a region of a lower pattern density. Due to a difference in growth rates of a film from one location to another, the amount of growth becomes locally dense or sparse depending on the local pattern density, and this causes non-uniformity in the thicknesses of the resulting film. Large variations in effective pattern density have been shown to result in significant and undesirable film thickness variation. For example, active regions that are surrounded by regions having a large area ratio of dielectrics (meaning less surface area for the epitaxial growth) would have faster growth of the epitaxy layer than other active regions. In addition, the composition of the epitaxy layer at the loosely packed active regions is also different from that of densely packed active regions. Particularly, this non-uniformity makes device formation process hard to control and device performance may be adversely affected.

The pattern-loading effects can be reduced by adjusting epitaxy parameters, such as reducing the process pressure or adjusting precursor flow rates. However, as a side effect, other epitaxy properties, such as composition, are also impacted by the changes of the pressure and the gas flow rate. Additionally, the amount of reduction in the pattern-loading effects using this method is not satisfactory.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An epitaxy process for growing source and drain stressors for Metal-Oxide-Semiconductor (MOS) devices is provided in accordance with various exemplary embodiments. The intermediate stages of forming the MOS devices are illustrated. The variations of the embodiments are discussed. Throughout the various views and illustrative embodiments, like reference numbers are used to designate like elements.

Figure 1:
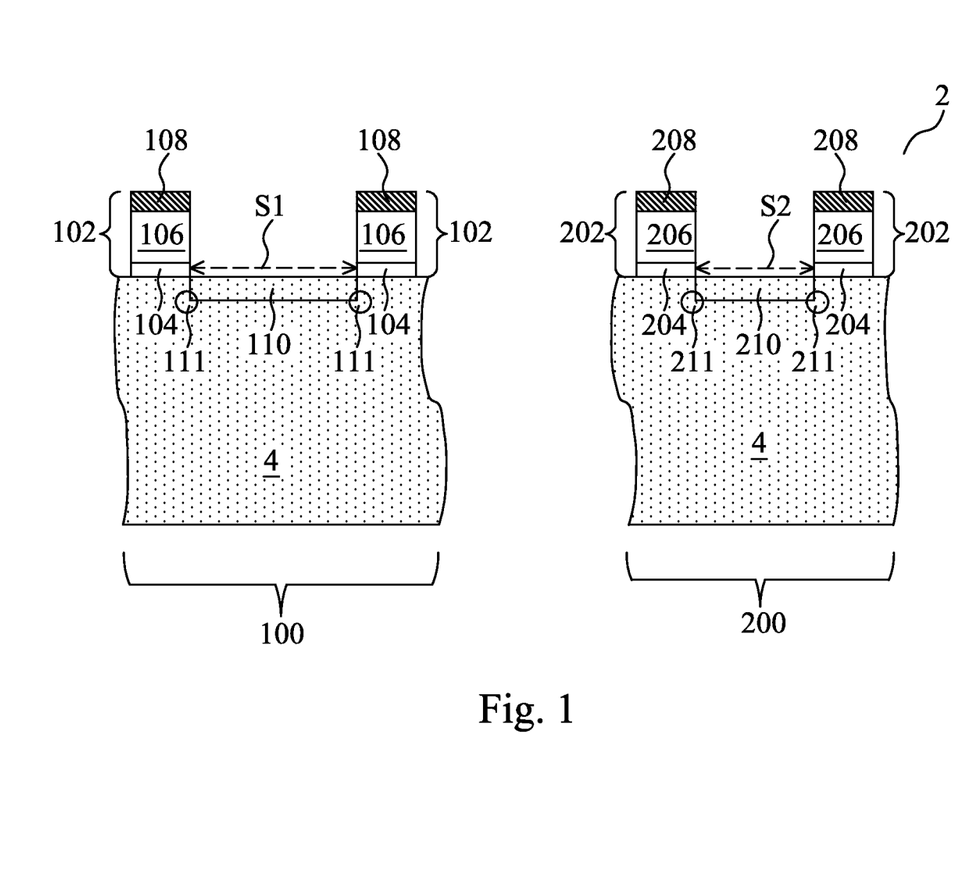
FIGS. 1 through 8 are cross-sectional views of intermediate stages in the manufacturing of Metal-Oxide-Semiconductor (MOS) devices in accordance with some exemplary embodiments.

FIG. 1 illustrates substrate 4, which is a portion of wafer 2 that comprises a first portion in device region 100 and a second portion in device region 200. Device regions 100 and 200 have different pattern densities and different sizes of exposed active regions. For example, distance S1 between neighboring gate stacks 102 in region 100 is greater than distance S2, which is between neighboring gate stacks 202 in region 200. Ratio S1/S2 may be greater than 2, greater than 5, or greater than 10. In some embodiments, device region 100 is a logic device region, which may be, for example, a core circuit region, an input/output (I/O) circuit region, and/or the like, while device region 200 is a memory circuit region comprising memory cells such as Static Random Access Memory (SRAM) cells. Accordingly, device region 200 may be an SRAM region. Substrate 4 may be a bulk semiconductor substrate such as a silicon substrate, or may have a composite structure, such as a Silicon-On-Insulator (SOI) structure.

Gate stacks 102 are formed in region 100 and over substrate 4, and include gate dielectrics 104 and gate electrodes 106. Gate stacks 202 comprising gate dielectrics 204 and gate electrodes 206 are formed in device region 200 and over substrate 4. Gate dielectrics 104 and 204 may comprise silicon oxide or a high-k material having a high k value, for example, higher than about 7. Gate electrodes 106 and 206 may include commonly used conductive materials such as doped polysilicon, metals, metal silicides, metal nitrides, and combinations thereof. Gate stacks 102 and 202 may also include hard masks 108, and 208, respectively, wherein hard masks 108 and 208 may comprise silicon nitride, for example.

Lightly Doped Drain/source (LDD) regions 110 and 210 are formed, for example, by implanting a p-type impurity into substrate 4. Gate stacks 102 and 202 act as implantation masks so that the inner edges of LDD regions 110 and 210 are substantially aligned with the edges of gate stacks 102 and 202, respectively. The LDD implantation may be performed using energies between about 1 keV and about 10 keV, and a dosage between about $1 \times 10^{13}/cm^2$ and about $1 \times 10^{16}/cm^2$. It is appreciated, however, that the values recited throughout the description are merely examples, and may be changed to different values. The LDD implantation may be tilted or vertical, with the tilt angle between about 0 degree and about 30 degrees. In addition, pocket regions 111 and 211 may also be formed, for example, by implanting an n-type impurity such as arsenic, phosphorous, or the like into substrate 4. The pocket implantation may be performed using energies between about 20 keV and about 80 keV, and a dosage between about $1 \times 10^{12}/cm^2$ and about $1 \times 10^{14}/cm^2$. The pocket implantation may be tilted, with the tilt angle greater than the tilt angle of the LDD implantation. In some embodiments, the tilt angle of the pocket implantation is between about 15 degree and about 45 degrees.

Figure 2:
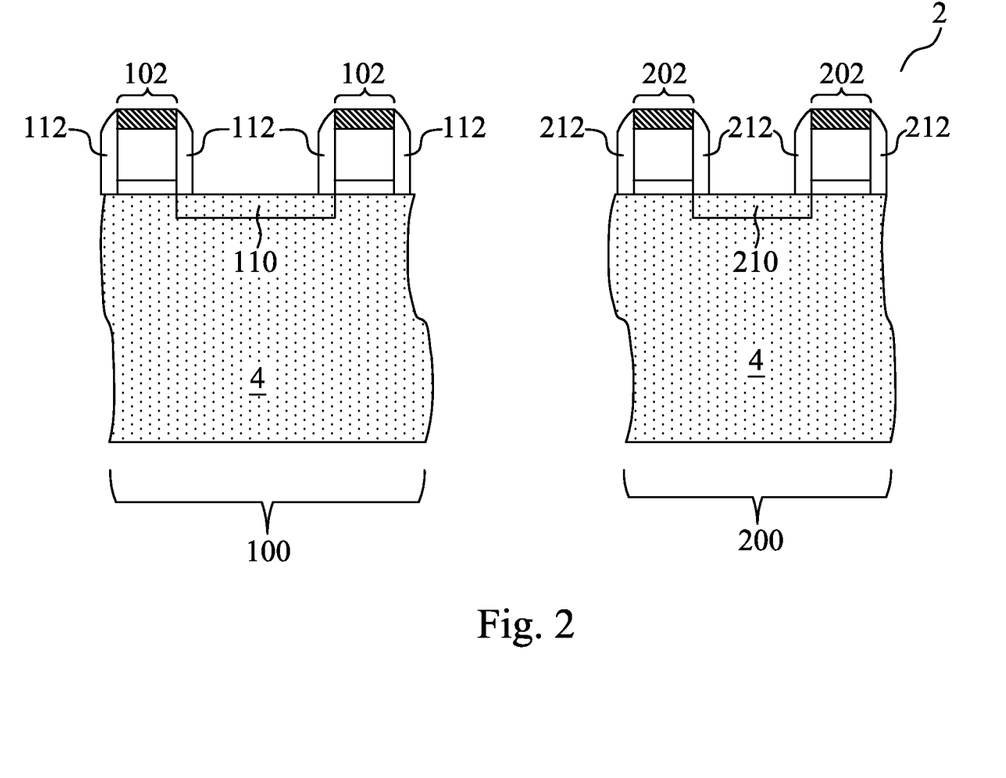

Referring to FIG. 2, gate spacers 112 and 212 are formed on the sidewalls of gate stacks 102 and 202, respectively. In some embodiments, each of gate spacers 112 and 212 includes a silicon oxide layer (not shown) and a silicon nitride layer over the silicon oxide layer, wherein the silicon oxide layer may have a thickness between about 15 Å and about 50 Å, and the thickness of the silicon nitride layer may be between about 50 Å and about 200 Å. In alternative embodiments, gate spacers 112 and 212 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

Figure 3:
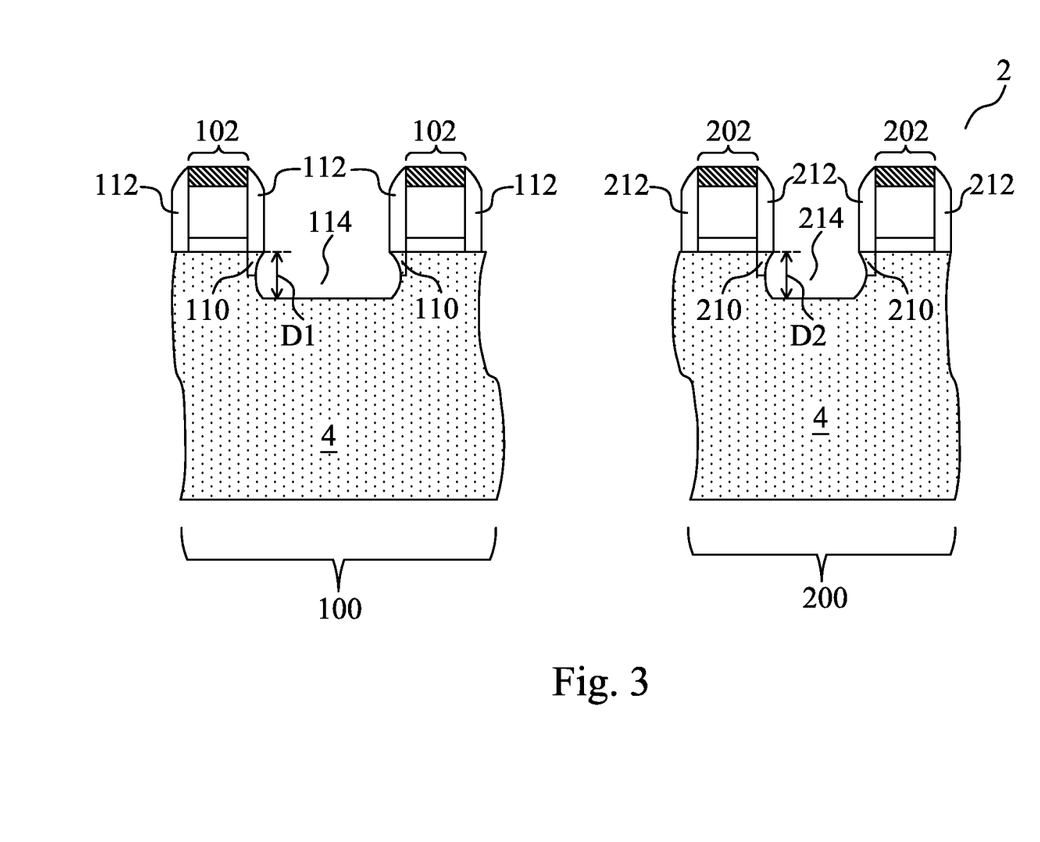

Referring to FIG. 3, an isotropic etch is performed to form openings 114 and 214 in device regions 100 and 200, respectively. The isotropic etch may be a dry etch, wherein the etching gas may be selected from $CF_4$, $Cl_2$, $NF_3$, $SF_6$, and combinations thereof. Depth D1 of opening 114 and depth D2 of opening 214 may be between about 150 Å and about 500 Å, for example.

Figure 4:
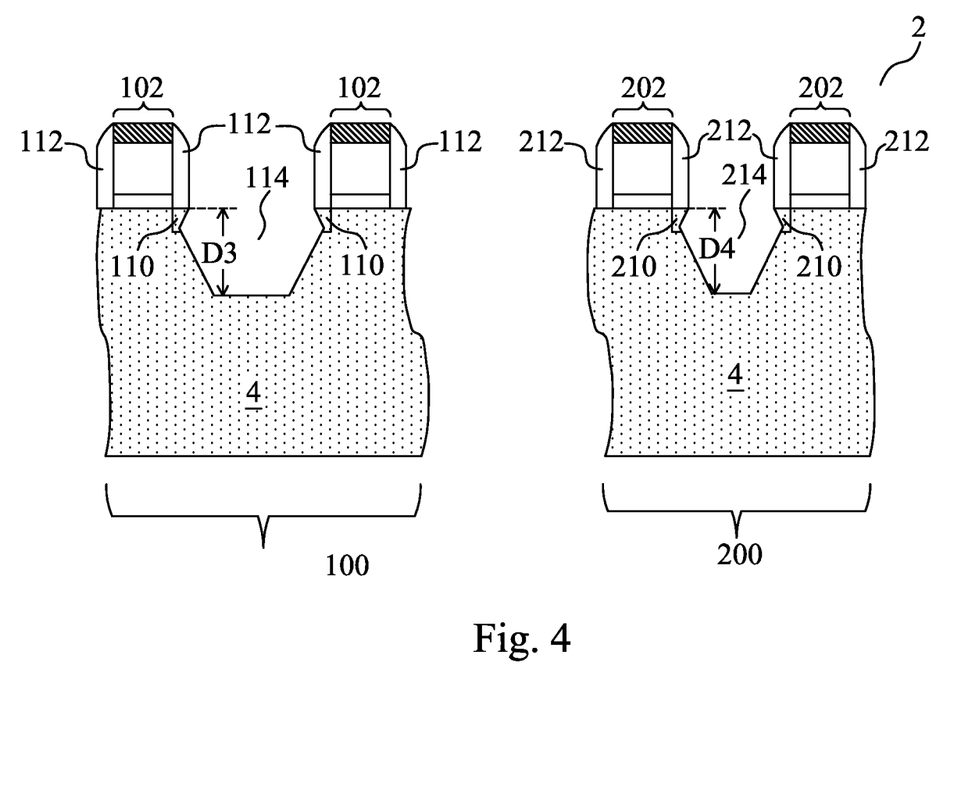

Next, as shown in FIG. 4, a wet etch is performed to expand openings 114 and 214, The wet etching may be performed, for example, using Tetra-Methyl Ammonium Hydroxide (TMAH), a potassium hydroxide (KOH) solution, or the like. In some exemplary embodiments, the TMAH solution has a concentration of between about one percent and about 30 percent. During the wet etch, the temperature of the TMAH may be between about 20° C. and about 100° C. After the wet etching, facets are formed in openings 114 and 214, which facets include (111) planes of substrate 4. In some exemplary embodiments, after the wet etching, depth D3 of opening 114 and depth D4 of opening 214 may be between about 300 Å and about 800 Å, for example.

Figure 5:
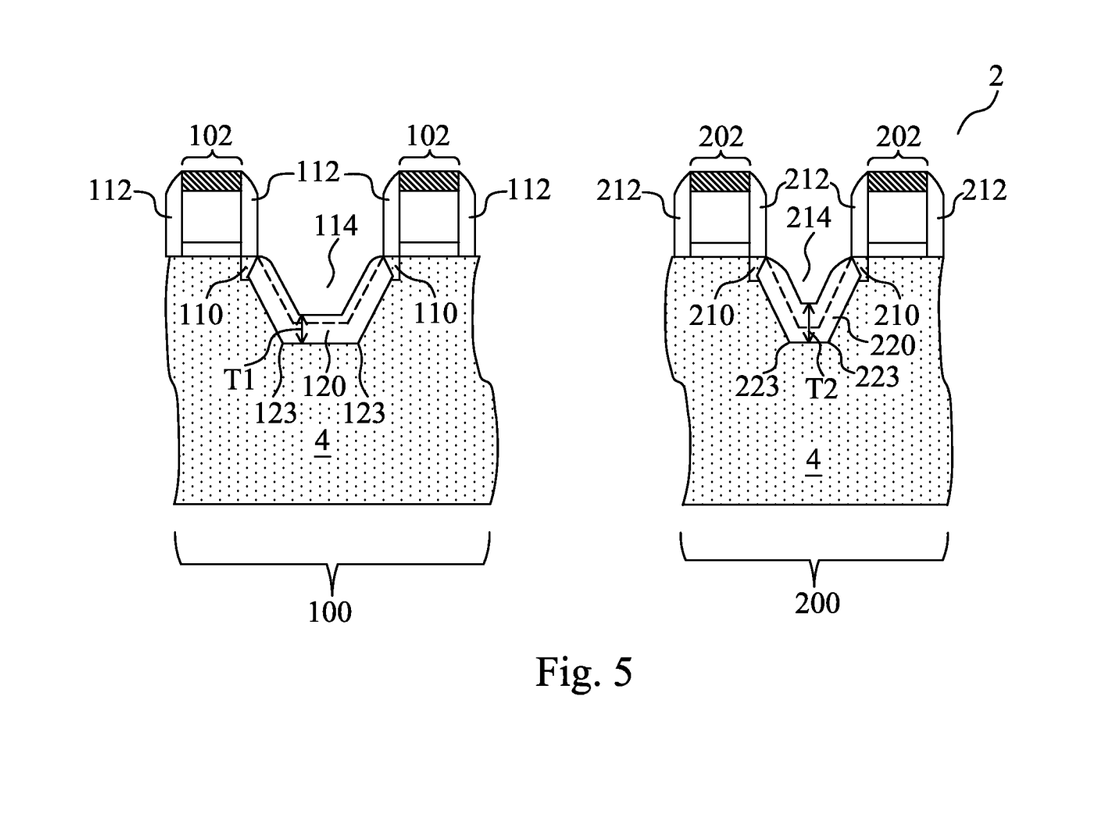

FIG. 5 illustrates the formation of epitaxy layers 120 and 220. Before the epitaxy, a pre-clean may be performed, for example, using an HF-based gas or a SiCoNi-based gas. The pre-clean may remove any undesirable silicon oxide that is formed as a result of the nature oxidation of the exposed surfaces in openings 114 and 214. In some embodiments, a high-temperature baking may be performed, although the baking may also be skipped. The high-temperature baking may be performed with or without the presence of HCl gas. The baking temperature may be between about 700° C. and about 900° C. The pressure of HCl may be between about 10 torr and about 200 torr. The baking duration may be between about 30 seconds and about 240 seconds, for example. The high-temperature baking may also remove the native oxide on the exposed surfaces of substrate 4, which exposed surfaces are in openings 114 and 214.

As shown in FIG. 5, a semiconductor material, such as silicon germanium (SiGe), is epitaxially grown in openings 114 and 214 by Selective Epitaxial Growth (SEG), forming epitaxy layers 120 and 220. The process gases may include $H_2$, $N_2$, dichloro-silane (DCS), $SiH_4$, $GeH_4$, and/or the like. The temperature of the epitaxy may be between about 600° C. and about 900° C. In some embodiments, an etching gas may also be added to promote the selective growth on the exposed surfaces of substrate 4, but not on dielectrics such as gate spacers 112 and 212. The pressure of the process gases may be between about 10 torr and about 200 torr. The resulting thickness T1 of epitaxy layer 120 and thickness T2 of epitaxy layer 220 may be between about 100 Å and about 400 Å, for example. During the epitaxy, desired impurities may be doped while the growth proceeds. For example, when boron is to be doped, $B_2H_6$ may be included in the process gases. Epitaxy layers 120 and 220 may have a first germanium atomic concentration between about 10 percent and about 30 percent, for example, although different germanium concentrations may also be used.

Due to pattern-loading effects, epitaxy layer 120 in region 100 has a lower growth rate than epitaxy layer 220 in region 200. Accordingly, thickness T1 of epitaxy layer 120 is smaller than thickness T2 of epitaxy layer 220. This may be caused due to the fact that at corners 123 and 223, the growth rates are higher than on (111) surfaces (the illustrated slant surfaces) and (100) surfaces (the illustrated horizontal bottom surfaces). In opening 214, the SiGe grown from two corners 223 merge with each other earlier than in opening 114, and hence causes thickness T2 to be greater than thickness T1. The difference in thicknesses T1 and T2 causes difficulty in subsequent device fabrication processes, and may adversely affect device performance, and thus is undesired.

Figure 6:
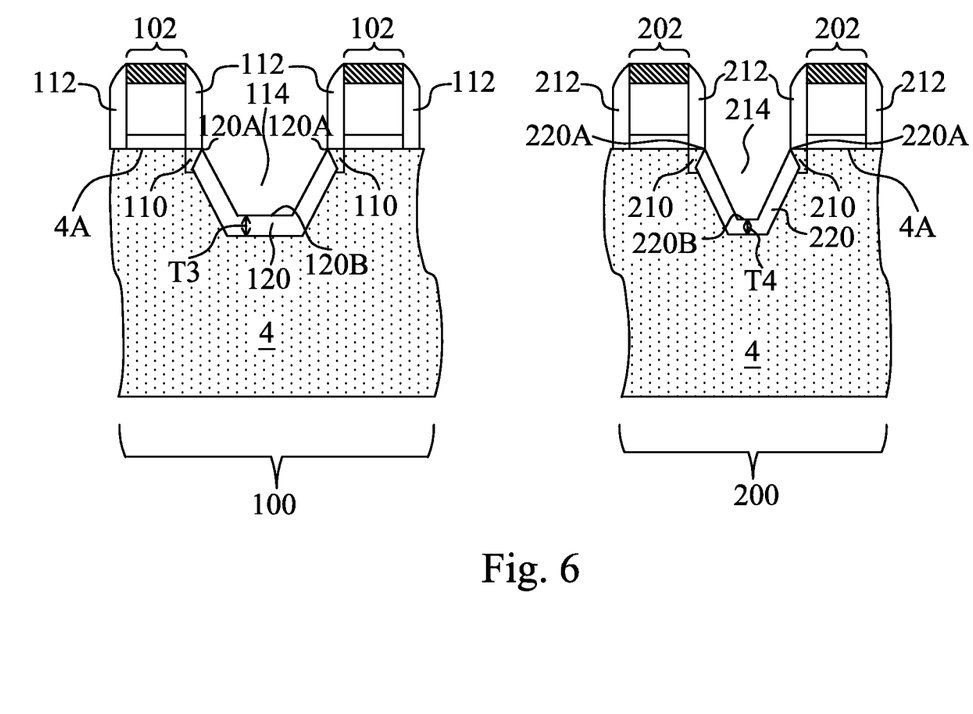

Next, an etch-back is performed to remove top portions of epitaxy layers 120 and 220, wherein the removed top portions of epitaxy layers 120 and 220 are schematically illustrated as the portions over dashed lines. The resulting structure is shown in FIG. 6. The etch-back may be performed using etching gases, which may be a combined gas of HCl and $GeH_4$, for example. In some embodiments, the formation of epitaxy layers 120 and 220 and the etch-back are in-situ performed, that is, in a same process chamber, with no vacuum break therebetween. In some embodiments, to perform the etch-back, the flow of the silicon-containing gas such as DCS and/or $SiH_4$ is turned off, so that the silicon-containing gas is no longer provided into the process chamber for performing the etch-back. $GeH_4$ may be used as a catalyst in the etch-back, so that the etch-back is accelerated. In some embodiments, the etch-back temperature is between about 550° C. and about 750° C. The pressure in the respective chamber is about 10 torr and about 200 torr. The etch-back time is about 30 seconds and about 300 seconds. The flow rates of HCl and $GeH_4$ may be between about 10 sccm and about 500 sccm. Furthermore, the flow rate of HCl and the flow rate of $GeH_4$ may have a ratio $FRHCL/FRGeH_4$ between about 1/5 and about 1/2, wherein FRHCL and $FRGeH_4$ are the flow rates of HCl and $GeH_4$, respectively.

In the etch-back, the etch-back rate in region 100 is smaller than in region 200. Accordingly, the thickness of epitaxy layer 220 is reduced more than the thickness of epitaxy layer 120. As a result, after the etch-back, thickness T3 of epitaxy layer 120 and thickness T4 of epitaxy layer 220 have a difference smaller than the difference between thicknesses T1 and T2 (FIG. 5). In some embodiments, when the etch-back is finished, thickness T3 is substantially equal to thickness T4, with a difference smaller than about 10 percent, or smaller than about 5 percent, of both thicknesses T3 and T4. After the etch-back, the top ends 120A and 220A of the remaining epitaxy layers 120 and 220 are level with or lower than top surface 4A of substrate 4. Epitaxy layers 120 and 220 may have horizontal bottom surfaces 120B and 220B lower than top surface 4A of substrate 4.

Figure 7:
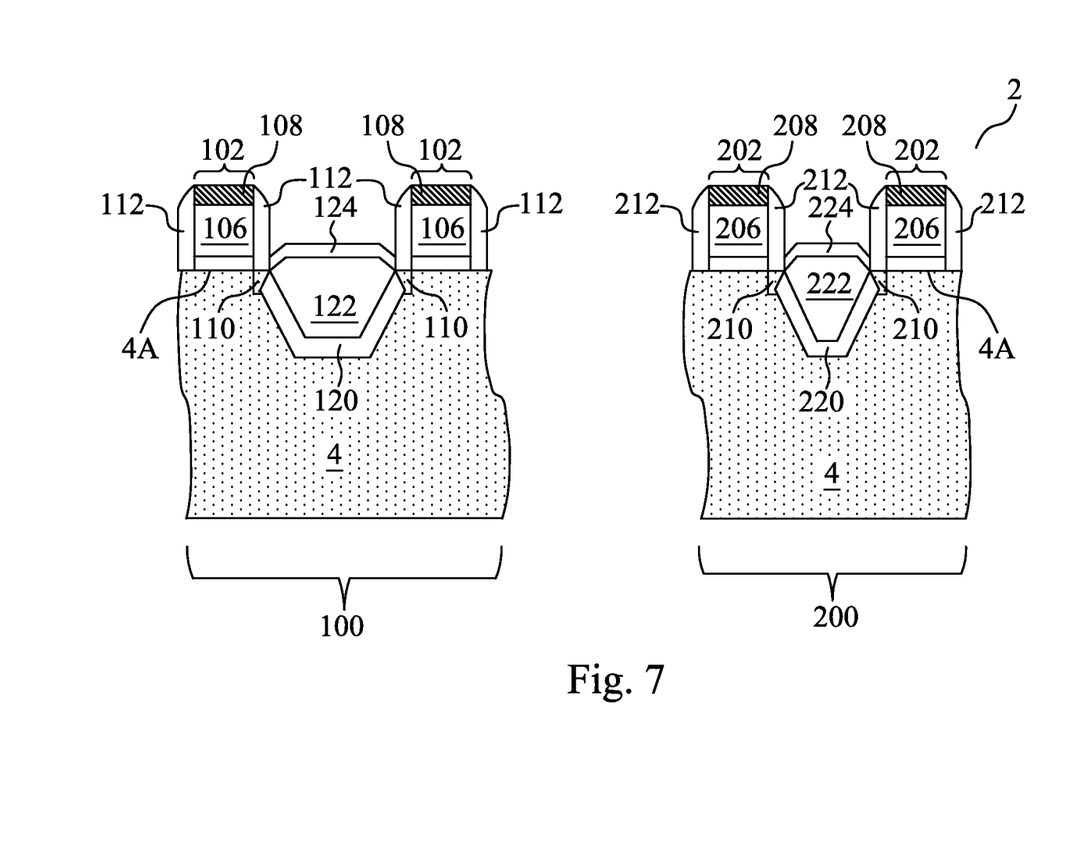

Referring to FIG. 7, epitaxy layers 122 and 222 are grown through an epitaxy, followed by the formation of epitaxy layers 124 and 224. Epitaxy layers 122 and 222 may have a composition (the elements contained therein and the percentages of the elements) different from the composition of epitaxy layers 120 and 220. Epitaxy layers 120 and 122 in combination form parts of the source or drain region (and also the source or drain stressor) of a MOS device, which also includes one of gate stacks 102 as its gate. Similarly, epitaxy layers 220 and 222 in combination also form parts of the source or drain region (and also the source or drain stressor) of a MOS device, which also includes one of gate stacks 202 as its gate. In some embodiments, epitaxy layers 122 and 222 are SiGe layers, which may have a germanium atomic concentration higher than the germanium atomic concentration in epitaxy layers 120 and 220. For example, epitaxy layers 122 and 222 may have a second germanium atomic concentration between about 30 percent and about 60 percent. Furthermore, the p-type impurity concentration in epitaxy layers 122 and 222 may also be higher than the p-type impurity concentration in epitaxy layers 120 and 220. The process conditions for forming epitaxy layers 122 and 222 may be similar to the process conditions for forming epitaxy layers 120 and 220, except that the ratios of silicon containing gases and germanium containing gases may be adjusted. In some embodiments, the top surfaces of epitaxy layers 122 and 222 may be higher than the top surface 4A of substrate 4.

After the formation of epitaxy layers 122 and 222, epitaxy layers 124 and 224 are formed through epitaxy. Epitaxy layers 124 and 224 may have a composition (including the elements contained therein and the percentages of the elements) different from the composition of epitaxy layers 122 and 222. Epitaxy layers 124 and 224 may be substantially pure silicon layers with no germanium comprised therein. Epitaxy layers 124 and 224 may also be SiGe layers, with the germanium concentration in epitaxy layers 124 and 224 lower than the germanium concentration in epitaxy layers 122 and 222. In some embodiments, the p-type impurity (if any) concentration in epitaxy layers 124 and 224 is lower than the p-type impurity concentration in epitaxy layers 122 and 222. The growth of epitaxy layers 120 and 220, the etch-back of epitaxy layers 120 and 220, and the growth of epitaxy layers 122, 222, 124, and 224 may be in-situ performed in a same chamber, with no vacuum break therein.

Figure 8:
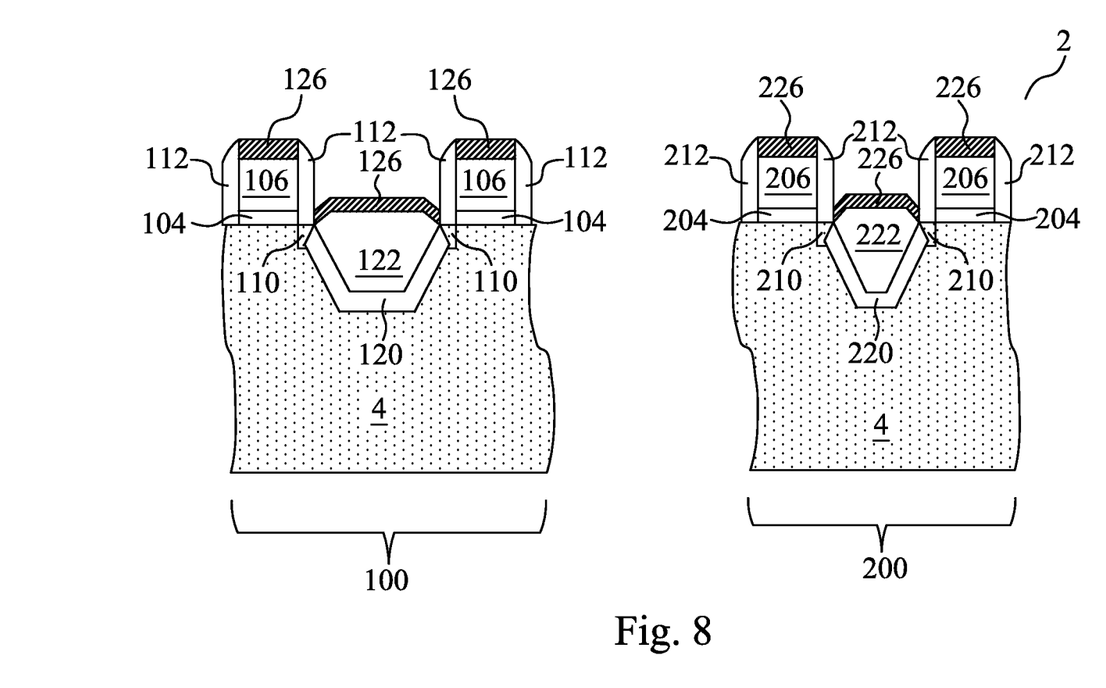

Hard masks 108 and 208 are then removed, and the resulting structure is shown in FIG. 8. FIG. 8 also illustrates the formation of silicide regions 126 and 226. Silicide regions 126 and 226 may be formed by depositing a thin layer (not shown) of metal, such as titanium, cobalt, nickel, tungsten, or the like, over the devices, including the exposed surfaces of epitaxy layers 124 and 224 and gate electrodes 106 and 206. Wafer 2 is then heated, which causes the silicide reaction to occur wherever the metal is in contact with silicon. After the reaction, a layer of metal silicide is formed between silicon and metal. The un-reacted metal is selectively removed through the use of an etchant that attacks metal but does not attack silicide. As a result of the silicidation, epitaxy layers 124 and 224 are substantially fully silicided in accordance with some embodiments. Alternatively, the top portions of epitaxy layers 124 and 224 are silicided, and the bottom portions of epitaxy layers 124 and 224 are not silicided. Portions of epitaxy layers 122 and 222 may also be silicided in other embodiments.

In the embodiments, by etching back epitaxy layers 120 and 220, the thicknesses of epitaxy layers 120 and 220 are substantially uniform. Experiments indicated that without performing the etch-back, the thicknesses (FIG. 5) of epitaxy layers 120 and 220 on a first sample wafer are 133 Å and 212 Å, respectively. By using the etch-back in accordance with embodiments, the thicknesses of epitaxy layers 120 and 220 on a second sample wafer (which is essentially the same as the first sample wafer) are 151 Å and 160 Å, respectively, which are much closer to each other. The improvement in the uniformity of the thicknesses of epitaxy layers 120 and 220 results in an improvement in the controllability in the device performance. For example, with the thicknesses of epitaxy layers 120 and 220 being more uniform, the amount of boron diffused from epitaxy layers 122 and 222 to the respective channels through epitaxy layers 120 and 220, respectively, is easier to control, resulting in an improvement in the control of short channel effect.

In accordance with embodiments, a method includes forming a gate stack over a semiconductor substrate, forming an opening in the semiconductor substrate and adjacent to the gate stack, and performing a first epitaxy to grow a first semiconductor layer in the first opening. An etch-back is performed to reduce a thickness of the first semiconductor layer. A second epitaxy is performed to grow a second semiconductor layer over the first semiconductor layer. The first and the second semiconductor layers have different compositions.

In accordance with other embodiments, a method includes forming a first gate stack and a second gate stack over a semiconductor substrate, and forming a first opening and a second opening in the semiconductor substrate and adjacent to the first and the second gate stacks, respectively. The first opening has a lateral size greater than a lateral size of the second opening. A first epitaxy is performed to grow a first semiconductor layer and a second semiconductor layer in the first and the second openings, respectively, wherein the second semiconductor layer has a thickness greater than a first thickness of the first semiconductor layer. An etch-back is performed on the first and the second semiconductor layers simultaneously. After the etch-back, thicknesses of the first and the second semiconductor layers are substantially equal to each other. A second epitaxy is performed to grow a third semiconductor layer and a fourth semiconductor layer over the first and the second semiconductor layers, respectively.

In accordance with yet other embodiments, a method includes forming a gate stack over a semiconductor substrate, forming an opening in the semiconductor substrate and adjacent to the gate stack, and performing a first epitaxy to grow a first silicon germanium layer in the first opening. The first silicon germanium layer has a first germanium atomic percentage. An etch-back is performed to reduce a thickness of the first silicon germanium layer. After the etch-back, a second epitaxy is performed to grow a second silicon germanium layer over the first silicon germanium layer. The second silicon germanium layer has a second germanium atomic percentage higher than the first germanium atomic percentage.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a gate stack over a semiconductor substrate;
   forming an opening in the semiconductor substrate and adjacent to the gate stack;
   performing a first epitaxy to grow a first semiconductor layer in the first opening;
   performing an etch-back to reduce a thickness of the first semiconductor layer;
   performing a second epitaxy to grow a second semiconductor layer over the first semiconductor layer; and
   doping p-type impurities into the first and the second semiconductor layers during the first epitaxy and the second epitaxy, respectively, wherein a p-type impurity percentage in the first semiconductor layer is lower than a p-type impurity in the second semiconductor layer.

2. The method of claim 1, wherein the first and the second semiconductor layers comprise silicon germanium, and wherein a germanium percentage in the second semiconductor layer is higher than a germanium percentage in the first semiconductor layer.

3. The method of claim 1, wherein the etch-back is performed using HCl and GeH$_4$ as etching gases.

4. The method of claim 1, wherein when the etch-back is finished, top ends of the first semiconductor layer are level with or lower than a top surface of the semiconductor substrate.

5. The method of claim 1, wherein the second semiconductor layer comprises top surfaces higher than a top surface of the semiconductor substrate.

6. The method of claim 1, wherein the etch-back is in-situ performed with the step of the first epitaxy, and wherein processes are transitioned from the first epitaxy to the etch-back by turning off silicon-containing gases in process gases that are used in the first epitaxy.

7. A method comprising:
   forming a first gate stack and a second gate stack over a semiconductor substrate;
   forming a first opening and a second opening in the semiconductor substrate and adjacent to the first and the second gate stacks, respectively, wherein the first opening has a lateral size greater than a lateral size of the second opening;
   performing a first epitaxy to grow a first semiconductor layer and a second semiconductor layer in the first and the second openings, respectively, wherein the second semiconductor layer has a thickness greater than a first thickness of the first semiconductor layer;
   performing an etch-back on the first and the second semiconductor layers simultaneously, wherein after the etch-back, thicknesses of the first and the second semiconductor layers are substantially equal to each other; and
   performing a second epitaxy to grow a third semiconductor layer and a fourth semiconductor layer over the first and the second semiconductor layers, respectively.

8. The method of claim 7, wherein the third and the fourth semiconductor layers have a composition different from a composition of the first and the second semiconductor layers.

9. The method of claim 8, wherein the first, the second, the third, and the fourth semiconductor layers comprise silicon germanium, and wherein a germanium percentage in the first and the second semiconductor layers is lower than a germanium percentage in the third and the fourth semiconductor layers.

10. The method of claim 7 further comprising in-situ doping p-type impurities in the first epitaxy and the second epitaxy, and wherein a p-type impurity percentage in the first and the second semiconductor layers is lower than a p-type impurity in the third and the fourth semiconductor layers.

11. The method of claim 7, wherein the etch-back is performed using HCl and GeH$_4$ as etching gases.

12. The method of claim 7, wherein when the etch-back is finished, top ends of the first and the second semiconductor layers are substantially level with or lower than a top surface of the semiconductor substrate.

13. The method of claim 7, wherein the third and the fourth semiconductor comprise top surfaces higher than a top surface of the semiconductor substrate, and bottom surface lower than the top surface of the semiconductor substrate.

14. A method comprising:
   forming a gate stack over a semiconductor substrate;
   forming an opening in the semiconductor substrate and adjacent to the gate stack;
   performing a first epitaxy to grow a first silicon germanium layer in the first opening, wherein the first silicon germanium layer has a first germanium atomic percentage;
   performing an etch-back to reduce a thickness of the first silicon germanium layer, wherein when the etch-back is finished, top ends of the first silicon germanium layer are substantially level with or lower than a top surface of the semiconductor substrate; and
   after the etch-back, performing a second epitaxy to grow a second silicon germanium layer over the first silicon germanium layer, wherein the second silicon germanium layer has a second germanium atomic percentage higher than the first germanium atomic percentage, and wherein the second silicon germanium layer has a top surface higher than the top surface of the semiconductor substrate.

15. The method of claim 14, wherein the second silicon germanium layer is formed to contact the first silicon germanium layer.

16. The method of claim 14, wherein the first epitaxy is performed using a process gas comprising HCl, GeH$_4$, and a silicon-containing process gas, and wherein the etch-back is performed by turning off the silicon-containing process gas and continue to introduce HCl and GeH$_4$.

17. The method of claim 14, wherein the etch-back is performed with a flow rate of HCl to a flow rate of GeH$_4$ having a ratio between about 1/5 and about 1/2.

18. The method of claim 14, wherein the step of forming the opening comprises:
   performing an isotropic etch to form the opening in the semiconductor substrate; and
   performing a wet etch to expand the opening and to expose (111) planes of the semiconductor substrate, wherein the (111) planes are in the opening.

* * * * *